(12) United States Patent
Fan et al.

(10) Patent No.: US 11,199,295 B2
(45) Date of Patent: Dec. 14, 2021

(54) CRYOSTAT FOR MAGNETIC RESONANCE IMAGING SYSTEM

(71) Applicant: SHANGHAI UNITED IMAGING HEALTHCARE CO., LTD., Shanghai (CN)

(72) Inventors: Ruoyun Fan, Shanghai (CN); Yan Guo, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 261 days.

(21) Appl. No.: 16/024,766

(22) Filed: Jun. 30, 2018

(65) Prior Publication Data
US 2019/0178445 A1     Jun. 13, 2019

(30) Foreign Application Priority Data
Dec. 8, 2017   (CN) .......................... 201711295894.1

(51) Int. Cl.
*F17C 3/08*      (2006.01)
*G01R 33/38*     (2006.01)
(Continued)

(52) U.S. Cl.
CPC .......... *F17C 3/085* (2013.01); *G01R 33/3804* (2013.01); *H01F 6/04* (2013.01); *G01R 33/3815* (2013.01)

(58) Field of Classification Search
CPC ...... F17C 3/085; F17C 13/007; F17C 13/087; F25B 9/10; F25B 9/14; F25B 2400/17;
(Continued)

(56) References Cited

U.S. PATENT DOCUMENTS 4,765,153 A * 8/1988 Wachi .................. F17C 3/085
                                                            62/383
5,782,095 A * 7/1998 Chen .................. G01R 33/3815
                                                            62/47.1
(Continued)

FOREIGN PATENT DOCUMENTS

CN        102360689 A      2/2012
CN        206293236 U      6/2017
(Continued)

OTHER PUBLICATIONS

Zhang, Bo et al., An experimental investigation on a novel liquid thermoelectric cooling device, Journal of Chemical Industry, 9(65): 3441-3446, 2014.
(Continued)

*Primary Examiner* — Brian M King
(74) *Attorney, Agent, or Firm* — Metis IP LLC

(57) ABSTRACT

Cryostat systems for magnetic resonance imaging system are provided. The cryostat system may include a tank containing a cavity to accommodate a cooling medium and a superconducting coil. The system may also include a cold head assembly configured to cool the cooling medium to maintain the superconducting coil in a superconducting state. The cold head assembly may be mounted on the tank. The cold assembly may include at least a first cold head and a second cold head. The second cold head may include a taper shape with a first end surface close to the first cold head and a second end surface away from the first cold head. A diameter of the first circular end is greater than a diameter of the second circular end.

20 Claims, 7 Drawing Sheets

(51) Int. Cl.
*H01F 6/04* (2006.01)
*G01R 33/3815* (2006.01)

(58) Field of Classification Search
CPC ........ F25D 19/00; F25D 19/006; F25D 19/02; G01R 33/3804; H01F 6/04
See application file for complete search history.

(56) References Cited

U.S. PATENT DOCUMENTS

2006/0022779 A1* 2/2006 Jiang ................ G01R 33/3815
  335/216
2007/0266714 A1* 11/2007 Fiedler .................... F25B 9/14
  62/6

FOREIGN PATENT DOCUMENTS

| CN | 106960713 A | 7/2017 | | |
| CN | 106449002 B | 12/2017 | | |
| EP | 0450972 A2 | 10/1991 | | |
| GB | 2575161 A | * 1/2020 | ........... | F25D 19/006 |
| JP | 2002270913 A | 9/2002 | | |

OTHER PUBLICATIONS

Personnel Department of the State Food and Drug Administration et al., Superconducting magnet, MRI equipment, pp. 158-163, 2010.
First Office Action in Chinese Application No. 201711295894.1 dated Oct. 28, 2019, 16 pages.

* cited by examiner

CRYOSTAT FOR MAGNETIC RESONANCE IMAGING SYSTEM

CROSS-REFERENCE TO RELATED APPLICATIONS

The present application is based on and claims the benefits of priority to Chinese Patent Application No. 201711295894.1, filed on Dec. 8, 2017, the entire contents of which are incorporated herein by reference.

TECHNICAL FIELD

The present disclosure relates to a medical imaging system, and more particularly to, a cryostat device of a magnetic resonance imaging system.

BACKGROUND

Magnetic resonance imaging (MRI) systems can obtain one-dimensional (1D) images, two-dimensional (2D) images, and three-dimensional (3D) images of a subject for diagnosis. MRI systems are often used to diagnose pathology and internal injuries. A typical MRI system may include a superconducting coil generating a strong and uniform main magnetic field in a scanning area of the MRI system. The superconducting coils may need to work properly at an environment with an extremely low temperature. The superconducting coils may be placed in a tank containing cryogen as liquid helium. A refrigerator may be used to recondense the boiling gas helium to liquid, and provide the cooling capacity to the tank to maintain the low temperature environment that the superconducting coils needs.

The refrigerator may provide the adequate cooling capacity to the tank, which may compensate a cooling capacity against heat leakage from an ambient environment of the MRI system. The cryostat system may be maintained in a stable low-temperature condition to ensure the superconducting coil to work properly. The refrigerator may include a GM (Gifford-McMahon) refrigerator and/or a pulsatron refrigerator.

However, a lifetime of the GM refrigerator may be about 10,000 hours, which means that it is necessary to perform a removal and/or an installation operation from/to the cold head sleeve in the cryostat system. In the hospital, a space between the cold head sleeve in the cryostat system and a ceiling above the cryostat system may be limited. It is therefore desirable to provide systems and methods for assembling the cold head sleeve in the cryostat system that may decrease the space required between the cold head and the ceiling during the removal and/or installation operations to the cold head assembly.

SUMMARY

In one aspect of the present disclosure, a cryostat for a magnetic resonance imaging system is provided. The system may include a tank containing a cavity to accommodate a cooling medium and a superconducting coil, and a cold head assembly configured to cool the cooling medium to maintain the superconducting coil in a superconducting state. The cold head assembly may be mounted on the tank. The central axis of the cold head assembly and a vertical line may form an angle. The vertical line may pass a reference point of the central axis of the cold head assembly. The vertical line may also be parallel to a vertical plane including an axis of the superconducting coil and a cross-section of the superconducting coil. The cold head assembly may include a first cold head and a second cold head. The second cold head may have a taper shape with a first end surface close to the first cold head and a second end surface away from the first cold head.

In some embodiments, the cold head assembly may be inclined away relative to the vertical plane.

In some embodiments, the cold head assembly may be inclined along the axis of the superconducting coil.

In some embodiments, the angle may be equal to or less than 45 degrees.

In some embodiments, a surface of the second cold head may include a plurality of protrusions. A recess may be formed between two adjacent protrusions of the plurality of protrusions.

In some embodiments, one of the plurality of protrusions may have a fin-like shape. The one of the plurality of protrusions may have a first end close to the first cold head and a second end away from the first cold head. The thickness of the first end of the one of the plurality of protrusions may be greater than the thickness of the second end of the one of the plurality of protrusions.

In some embodiments, the surface of the second cold head or a surface of the plurality of protrusions may be polished or has a plating layer.

In some embodiments, the system may further include a radiation shield and a vacuum layer. The radiation shield and the vacuum layer may enclose the tank. The system may also include a heat conductive band located in the vacuum layer and configured to thermal connect the radiation shield and the cold head assembly.

In some embodiments, the taper shape may include a shape of triangular prism, polygonous prism or truncated cone In some embodiments, a diameter of the first end surface may be greater than a diameter of the second end surface.

In another aspect of the present disclosure, a system is provided. The system may include a cold head assembly. The cold head assembly may include at least a first cold head and a second cold head. The second cold head may have a taper shape with a first end surface close to the first cold head and a second end surface away from the first cold head. The diameter of the first end surface may be greater than a diameter of the second end surface.

In some embodiments, a surface of the second cold head may include a plurality of protrusions, a recess being formed between two adjacent protrusions of the plurality of protrusions.

In some embodiments, one of the plurality of protrusions may have a fin-like shape. The one of the plurality of protrusions may have a first end close to the first cold head and a second end away from the first cold head. The thickness of the first end of the one of the plurality of protrusions may be greater than the thickness of the second end of the one of the plurality of protrusions.

In some embodiments, the surface of the second cold head or a surface of the plurality of protrusions may be polished or have a plating layer.

In some embodiments, the system may further include a tank containing a cavity to accommodate a cooling medium and a superconducting coil, and a cold head assembly configured to cool the cooling medium to maintain the superconducting coil in a superconducting state. The cold head assembly may be mounted on the tank. The central axis of the cold head assembly and a vertical line may form an angle. The vertical line may pass a reference point of the central axis of the cold head assembly. The vertical line may also be parallel to a vertical plane including an axis of the superconducting coil and a cross-section of the superconducting coil.

In some embodiments, the cold head assembly may be inclined away relative to the vertical plane.

In some embodiments, the cold head assembly may be inclined along the axis of the superconducting coil.

In some embodiments, the angle may be equal to or less than 45 degrees.

In some embodiments, the system may further include a radiation shield and a vacuum layer. The radiation shield and the vacuum layer may enclose the tank The system may also include a heat conductive band located in the vacuum layer and configured to thermal connect the radiation shield and the cold head assembly.

In some embodiments, the taper shape may include a shape of triangular prism, polygonous prism or truncated cone.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
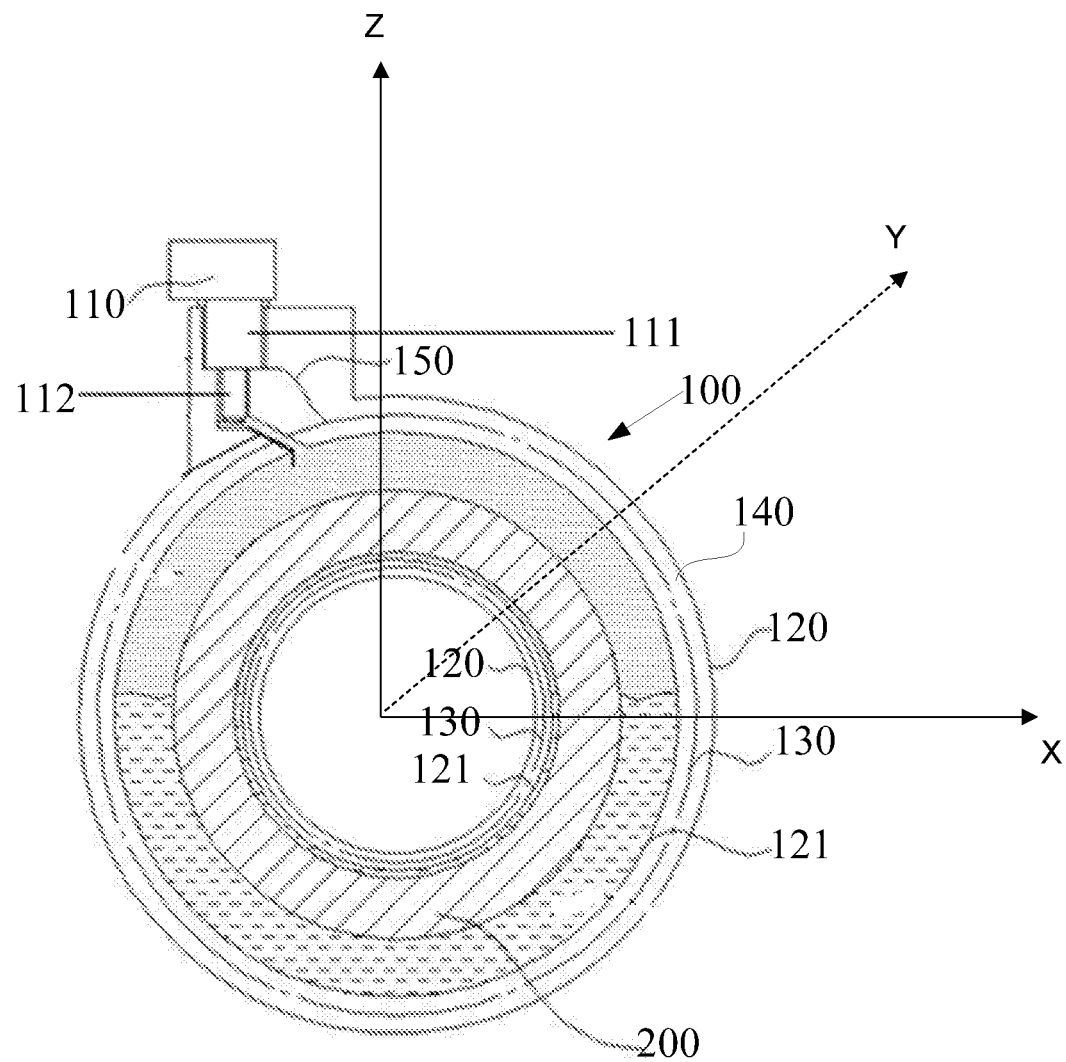
FIG. 1 is a schematic diagram illustrating an exemplary cryostat system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The following descriptions are provided with reference to a cooling technique for maintaining a superconducting coil of an imaging system in a superconducting state. The imaging system may be used for non-invasive imaging, which may be used for disease diagnosis, disease treatment or research purposes. In some embodiments, the imaging system may include one or more modalities including Magnetic Resonance Imaging (MRI), Magnetic Resonance Angiography (MRA), CT (computed tomography)-MR, DSA (digital subtraction angiography)-MR, PET (positron emission tomography)-MR, TMS (transcranial magnetic stimulation)-MR, US (ultrasound scanning)-MR, X-ray-MR, or the like, or any combination thereof. In some embodiments, the subject to be scanned by the imaging system may be an organ, a texture, a lesion, a tumor, a substance, or the like, or any combination thereof. Merely by way for example, the subject may include a head, a breast, a lung, a rib, a vertebra, a trachea, a pleura, a mediastinum, an abdomen, a long intestine, a small intestine, a bladder, a gallbladder, a triple warmer, a pelvic cavity, a backbone, extremities, a skeleton, a blood vessel, or the like, or any combination thereof. As another example, the subject may include a physical model. It is understood that this is not intended to limit the scope of the present disclosure. For persons having ordinary skills in the art, a certain amount of variations, changes and/or modifications may be deducted under the guidance of the present disclosure. Those variations, changes and/or modifications do not depart from the scope of the present disclosure.

FIG. 1 is a schematic diagram illustrating an exemplary cryostat system of an imaging system according to some embodiments of the present disclosure. In some embodiments, the cryostat system 100 may be used to cool a superconducting coil 200 of the imaging system. The imaging system may include a scanner, a processing device, a storage device, a network, etc. (not shown in FIG. 1). The scanner may include a cryostat system (e.g., the cryostat system 100), a superconducting coil (e.g., superconducting coil 200), a radiofrequency (RF) coil assembly (not shown in the figure), a gradient coil assembly (not shown in the figure), or the like, or any combination thereof.

The superconducting coil 200 of the imaging system may generate a first magnetic field (also referred to herein as a main magnetic field) for polarizing a subject to be scanned. The main field may be named to $B_0$ herein. The RF coil assembly may include a plurality of coils (e.g., transmit coils, receiver coils, etc.) for transmitting and/or receiving RF signals. The gradient coil assembly may generate a second magnetic field (also referred to herein as a gradient magnetic field). The gradient coil assembly may be assembled in an area surrounding a scanning region of the imaging system. The processing device may receive signals generated by the coils (e.g., the superconducting coil, the RF coil, and the gradient coil) and further transform the signals into other types of data (e.g., image data). The superconducting coil 200 may work in conjunction with the gradient coil assembly. For example, when the imaging system collects sequences data, the main magnetic field may be temporarily pulsed, and the imaging system may generate sequence data for controlling magnetic gradients of the gradient coil. The superconducting coil 200 may be operative at a low temperature (e.g., 4.2 K). Therefore, the imaging system may consume a certain amount of cold head cooling capacity (e.g., 200 MW).

The cryostat system 100 may maintain the superconducting coil 200 in a superconducting state so that the superconducting coil 200 may work properly. The cryostat system 100 may liquefy a vapor-state cooling medium (e.g., vapor-state helium) into a liquid state. The superconducting state refers to a state of a superconductor material in which the superconductor material has superconducting properties, such as a zero electrical resistive state. In some embodiments, the superconductor material may be in a superconducting state when the superconductor material is exposed in a low-temperature ambient (e.g., 4.2 K).

As shown in FIG. 1, the cryostat system 100 may include a cold head assembly 110, a tank 120, a radiation shield 130, a vacuum layer 140, and a heat conductive band 150, etc.

The tank 120 may contain a cavity 121 to accommodate the cooling medium and the superconducting coil 200. The cooling medium may include a coolant in a vapor state, liquid state, or both vapor and liquid states. For example, the cooling medium may include the vapor-state helium and liquid-state helium. In some embodiments, the superconducting coil 200 may be immersed in the cooling medium including the vapor-state cooling medium and the liquid-state cooling medium.

The cold head assembly 110 may be configured to cool the cooling medium to maintain the superconducting coil 200 in a superconducting state (e.g., a low-temperature superconducting state). The cold head assembly 110 may provide cooling compensation to the cooling medium since the heat from outside ambient of the imaging system may leak into the cavity 121. The amount of the cooling compensation may be greater than the amount of the heat leaked into the cryostat system 100. The cryostat system 100 may be at a stable temperature to ensure that the superconducting coil 200 can work properly. Take the cooling medium being helium as an example; the liquid-state helium may be stored in the cavity 121 of the tank 120. The liquid-state helium may evaporate into a vapor state after absorbing the heat leaked in from the ambient. The vapor-state helium may rise to the top of the cavity 121 and become close to the cold head assembly 110. The cold head assembly 110 may provide a cooling capacity to the cavity 121 for exchanging heat with the vapor-state helium. The vapor-state helium may be liquefied into a liquid state. The liquefied helium may transfer a certain amount of cooling capacity to the bottom region of the cavity 121. The evaporation portion of the cooling medium may be reduced, thereby reducing the loss of the cooling medium. In some embodiments, the cold head assembly 110 may include a cold head assembly of a GM (Gifford-Mcmahon) refrigerator, a cold head assembly of a Sterling refrigerator, or the like, or any combination thereof.

The cold head assembly 110 may be mounted on the tank 120 (e.g., on the side of the tank 120 as shown in FIG. 1). The central axis of the cold head assembly 110 and a vertical line may form an angle that is greater than 20 degrees (e.g., 25 degrees, 29 degrees, 36 degrees, 45 degrees, etc.). The central axis of the cold head assembly 110 refers to a line that passes both the center of the top surface of the cold head assembly 110 and the center of the bottom surface of the cold head assembly 110. The vertical line may pass a reference point on the central axis of the cold head assembly 110 and be parallel to a vertical plane including an axis of the superconducting coil 200 and a cross-section of the superconducting coil 200. The reference point on the central axis of the cold head assembly 110 may be the center of the bottom surface of the cold head assembly 110. In some embodiments, the center of the bottom surface of the cold head assembly 110 may be the same as an intersection point of the cold head assembly 110 and the tank 120. The cold head assembly 110 may rotate with the reference point. For illustration purposes, a coordinate system (e.g., a Cartesian coordinate system) that designates the center of the superconducting coil 200 as the origin may be presented in FIG. 1. The coordinate system may include X axis, Y axis, and Z axis. The Z-axis may be perpendicular to the X-axis and the Y-axis. The X-Y plane may be parallel to a ground plane that the cryostat system 100 is located in (e.g., the horizontal plane). The vertical line refers to a line that passes the reference point of the central axis of the cold head assembly 110 and is parallel to the Z-axis. The corresponding vertical plane including an axis of the superconducting coil 200 (e.g., the Z-axis and/or the Y-axis) and a cross-section thereof is the Z-Y plane.

In some embodiments, the cold head assembly 110 may be inclined relative to the reference point that the top of the cold head assembly 110 may be distant to the vertical line. The cold head assembly 110 may be inclined in a plane parallel with the Z-X plane, inclined in a plane parallel with the Z-Y plane or inclined in a plane not parallel with both the Z-X plane and the Z-Y plane. The angle between the vertical line and the central axis of the cold head assembly 110 may range from 20 degrees to 45 degrees. For example, when the angle between the vertical line and the central axis of the cold head assembly 110 is 25 degrees, a trajectory of the central axis of the cold head assembly 110 may be a cone including the vertical line as a rotation axis and the conning angle may be 50 degrees. As another example, when the angle between the vertical line and the central axis of the cold head assembly 110 is 45 degrees, a trajectory of the central axis of the cold head assembly 110 may be a cone including the vertical line as a rotation axis and the coning angle may be 90 degrees. In some embodiments, the cold head assembly 110 may include a first cold head 111 (shown in FIG. 2), a second cold head 112, etc. Detailed descriptions of the cold head assembly 110 may be found elsewhere of the present disclosure (e.g., FIG. 2, FIG. 3).

The radiation shield 130 and the vacuum layer 140 may enclose the tank 120 as shown in FIG. 1. The radiation shield 130 and the vacuum layer 140 may decrease the heat radiation and convection from the outside ambient of the cryostat system 100 and reduce the evaporation of the cooling medium (e.g., helium).

The heat conductive band 150 may be located in the vacuum layer 140 and may thermal connect the radiation shield 130 and the first cold head 111. The heat conductive band 150 may transmit the cooling capacity of the first cold head 111 to the radiation shield 130 to cool the radiation shield 130 to proper low temperature. In some embodiments, the heat conductive band 150 may be a flexible thermal conductivity band or braid. The heat conductive band 150 may be made of a high thermal conductivity material, such as high purity copper, high purity aluminum, etc.

These descriptions are intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the cryostat system 100 may be a part of the imaging system. As another example, the cold head assembly 110 may be mounted on the right side of the tank 120.

Figure 2:
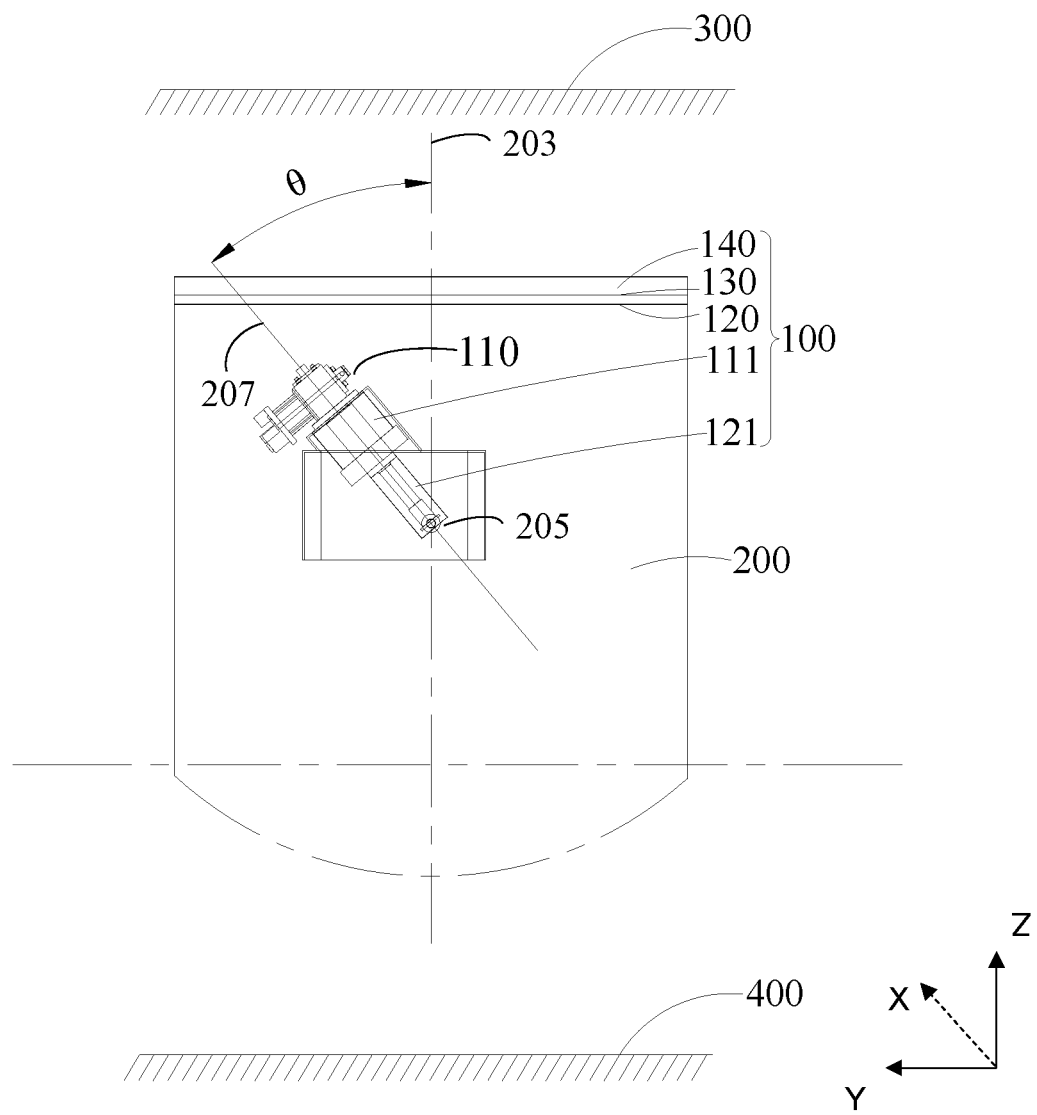
FIG. 2 is a schematic diagram illustrating an exemplary cold head position of the cryostat system 100 in hospital field according to some embodiments of the present disclosure.

FIG. 2 is a schematic diagram illustrating an exemplary cold head position of the cryostat system 100 in hospital field according to some embodiments of the present disclosure. In some embodiments, FIG. 2 is a side view of the cryostat system shown in FIG. 1. The cryostat system 100 may include the cold head assembly 110 (including a first cold head 111, etc.), the tank 120, the radiation shield 130, the vacuum layer 140, and other components shown in other figures of the present disclosure (e.g., FIG. 1 and the descriptions thereof). For illustration purposes, FIG. 2 may also include a ceiling 300 and a ground plane 400 indicating an operable state environment of the cryostat system 100, and a side view of the coordinate system (whose origin may be the center of the superconducting coil 200 as shown in FIG. 1). Therefore, FIG. 2 may be a front view of the cryostat system 100 corresponding to the Y-Z plane. In some embodiments, the ceiling 300 and/or the ground plane 400 may be parallel to the X-Y plane. The vertical line 203 that passes the reference point 205 may be perpendicular to the ceiling 300 and/or the ground plane 400, and also parallel to the Z-axis.

As shown in FIG. 2, the angle between the central axis 207 of the cold head assembly 110 and the vertical line 203 is denoted as θ. The angle may represent an inclined degree of the cold head assembly 110 relative to the cryostat system 100. The angle θ may be greater than 20 degrees and not greater than 45 degrees. In some embodiments, the cold head assembly may be inclined towards any direction around the reference point 205. For example, the cold head assembly 110 may be inclined along an axis of the coordinate system (whose origin may be the center of the superconducting coil 200). For instance, the cold head assembly 110 may be inclined along the Y-axis as shown in FIG. 2. Similarly, the cold head assembly may be inclined around the reference point 205 along the X-axis, or any other direction in the X-Y plane.

During an installation or removal operation to the cold head assembly 110, the cold head assembly 110 may need to be raised (or pulled). Thus, the space between the top of the cold head assembly 110 and the ceiling 300 may be reduced during the installation or removal of the cold head assembly 110. The height of the ceiling 300 may need to be greater than an appropriate value to ensure the operation of installation or removal operation of the cold head assembly 110. In the present disclosure, the inclined mounting of the cold head assembly 110 may decrease the height requirement of the ceiling 300, which may make the operation of installation or removal of the cold head assembly 110 easier.

These descriptions are intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the ceiling 300 is unnecessarily parallel to the ground plane 400. The vertical line 203 may be perpendicular to the ground plane 400.

Figure 3:
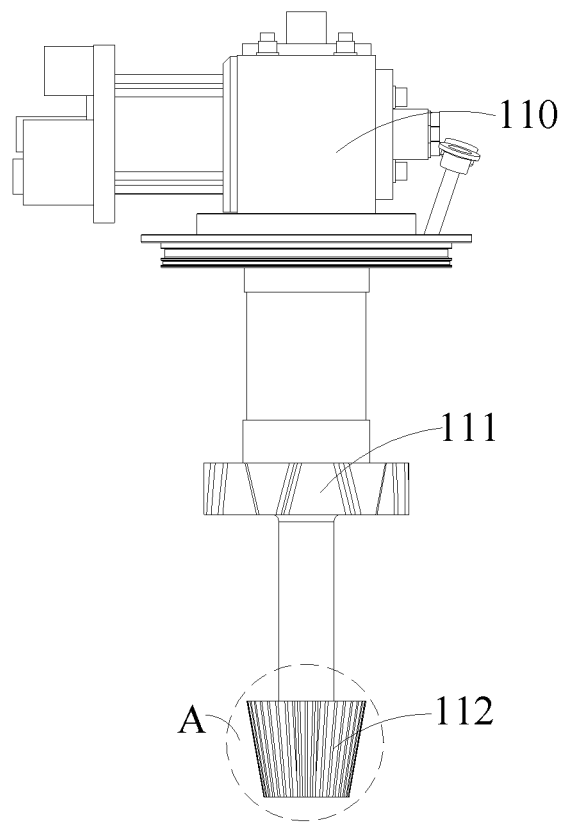
FIG. 3 is a schematic diagram illustrating an exemplary cold head assembly according to some embodiments of the present disclosure.

FIG. 3 is a schematic diagram illustrating an exemplary cold head assembly according to some embodiments of the present disclosure. As shown in FIG. 3, the cold head assembly 110 may include the first cold head 111, the second cold head 112, and other components. The cold head assembly 110 may provide the cooling capacity in two stages by the first cold head 111 and the second cold head 112, respectively. In some embodiments, some of the vapor-state cooling medium (e.g., vapor-state helium) may become close to the second cold head 112 and be liquefied into the liquid state by absorbing the cooling capacity provided by the second cold head 112. The liquefied cooling medium (e.g., liquefied helium) may drop down toward the bottom region of the tank 120, which includes a cold head sleeve and a liquid helium vessel in an exemplary cryostat system.

The first cold head 111 may be connected with the radiation shield 130 via the heat conductive band 150 (not shown in FIG. 3). In some embodiments, the first cold head 111 may be maintained at a first temperature, for example, 40 K. The heat conductive band 150 may conduct the cooling capacity absorbed from the first cold head 111 to the radiation shield 130. In some embodiments, the temperature of the radiation shield 130 may be reduced to more than 50 K. Therefore, the heat from outside ambient may be interrupted.

The second cold head 112 may have a taper shape. For example, the second cold head 112 may have a truncated cone shape (as shown in FIG. 3) or a triangular prism or polygonous prism (e.g, rectangular prism) shape (not shown in FIG. 3) with a first end surface and a second end surface. The first end surface may be close to the first cold head 111. The second end surface may be away from to the first cold head 111 compared to the first end surface. A diameter of the first circular end surface that close to may be greater than a diameter of the second end surface. In some embodiments, when the second cold head 112 s shaped as truncated cone shape, the first end surface and the second end surface thereof may be configured as a first circular end and a second circular end, respectively. The first circular end may be close to the first cold head 111. The second circular end may be distant to the first cold head 111 compared to the first circular end. The diameter of the first circular end (also referred to herein as a first diameter) may be greater than the diameter of the second circular end (also referred as a second diameter). For example, the first diameter may be 8 cm, and the second diameter may be 6.5 cm. In some embodiments, the second cold head 112 may be maintained at a second temperature, for example, 4.2 K or lower than 4.2 K (4.2 K is a critical temperature of liquid-state helium). The second cold head 112 may provide the cooling capacity to liquefy the vapor-state cooling medium into the liquid state when some of the vapor-state cooling medium becomes close to the second cold 112 head. The liquefied cooling medium (e.g., liquefied helium) may be deposited on a side surface of the second cold head 112, and slide down along the surface of the second cold head 112, and further drop down toward to the bottom region of the tank 120.

These descriptions are intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the cold head assembly 110 may provide the cooling capacity in three stages. The cold head assembly 110 may further include a third cold head between the first cold head 111 and the second cold head 112.

Figure 4:
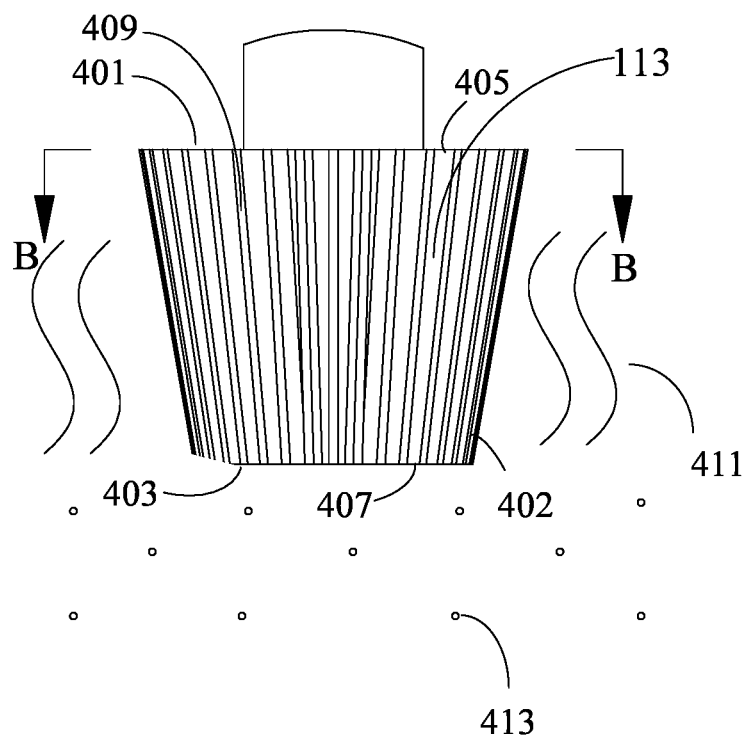
FIG. 4 is a schematic diagram illustrating an exemplary second cold head according to some embodiments of the present disclosure.

FIG. 4 is a schematic diagram illustrating an exemplary second cold head according to some embodiments of the present disclosure. As shown in FIG. 4, the second cold head 112 may include a first circular end 401, a second circular end 403, and a side surface 402 shown in other figures of the present disclosure (e.g., FIG. 3). The first circular end 401 may be close to the first cold head 111. The second circular end 403 may be distant to the first cold head 111 compared to the first circular end. The side surface 402 may include a plurality of protrusions 113. Two adjacent protrusions of the plurality of protrusions may form a recess 409.

In some embodiments, each of the plurality of protrusions 113 may include a fin-like shape. Each of the plurality of protrusions 113 may have a first end 405 close to the first circular end 401 and a second end 407 close to the second circular end 403. That is, each of plurality of protrusions 113 protrusion may have the first end 405 close to the first cold head 111 and the second end 407 away from the first cold head 111. The thickness of the first end 405 of the fin-like shape protrusion 113 (also referred to herein as the first thickness) may be greater than the thickness of the second end 407 of the fin-like shape protrusion 113 (also referred to herein as the second thickness). The first thickness refers to a contact region having a width between the first end 405 and the second cold head 112. The second thickness refers to a contact region having a width between the second end 407 and the second cold head 112. Detailed descriptions of the second cold head 112 may be found elsewhere of the present disclosure (e.g., the description of FIGS. 4, 5, and 6).

The fin-like shape protrusions 113 may increase a contact surface area between the second cold head 112 and the vapor-state cooling medium (e.g., vapor-state helium) and thus increase the heat exchange surface between them. For illustration purposes, in FIG. 4, the vapor-state cooling medium is denoted by wavy lines 411, and the liquid-state cooling medium is denoted by circles 413. The second cold head 112 may exchange heat with the vapor-state cooling medium. Some of the vapor-state cooling medium may be liquefied into the liquid state. The liquefied cooling medium may be deposited on the surface of the second cold head 112 and flow along surfaces of the plurality of protrusions 113 toward the bottom region of the tank 120 as the result of gravity.

In some embodiments, the second cold head 112 and/or the protrusions 113 may be made of a high thermal conductivity material, such as high purity copper, high purity aluminum, etc. In some embodiments, the surface of the second cold head 112 and/or the surface of the plurality of protrusions may be polished and/or have a plating layer. The plating layer may include electroplated Cu plated by an electro-coppering technique, which may smooth surfaces and/or reduce frictions.

These descriptions are intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the one of the plurality of protrusions may include a columnar shape. The columnar shape protrusion may have a first end close to the first circular end 401 of the second cold head 112 and a first end close to the second circular end 403 of the second cold head 112. The thickness of the first end of the columnar shape protrusion may be equal to the thickness of the second end of the columnar shape protrusion.

Figure 5:
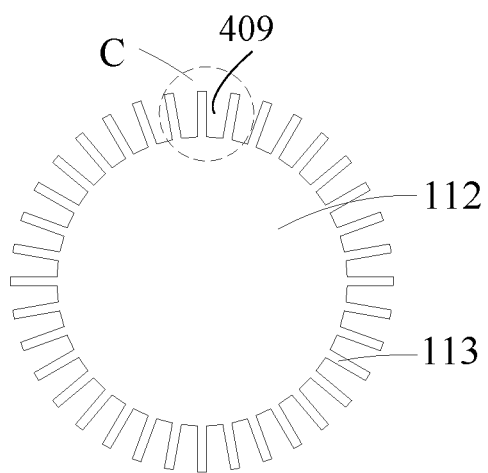
FIG. 5 is a schematic diagram illustrating an exemplary second cold head according to some embodiments of the present disclosure.

FIG. 5 is a schematic diagram illustrating an exemplary second cold head according to some embodiments of the present disclosure. FIG. 5 is a top view of the second cold head 112 from the perspective of the first circular end as arrow B shown in FIG. 4. The second cold head 112 may include the plurality of fin-like shape protrusions 113. Two adjacent protrusions of the plurality of protrusions 113 may form a recess 409 as described elsewhere in the present disclosure (e.g., FIG. 4 and the descriptions thereof).

Figure 6:
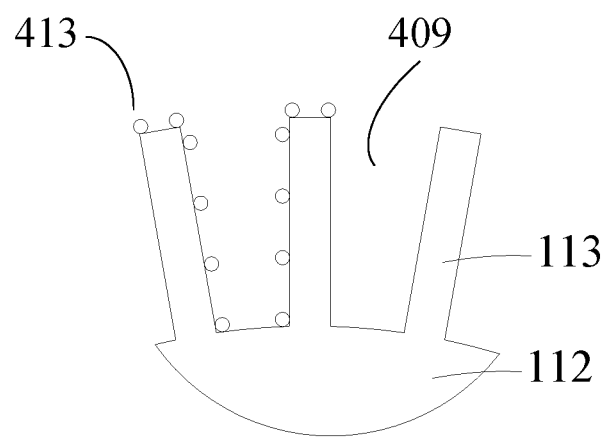
FIG. 6 is a schematic diagram illustrating a part of an exemplary second cold head according to some embodiments of the present disclosure.

FIG. 6 is a schematic diagram illustrating a part of an exemplary second cold head according to some embodiments of the present disclosure. FIG. 6 is an enlarged view of part C of the second cold head 112 shown in FIG. 5. The second cold head 112 may include a plurality of fin-like shape protrusions 113 (also referred to herein as fins 113). Two adjacent protrusions of the plurality of protrusions 113 may form a recess 409 as described elsewhere in the present disclosure (e.g., FIG. 4 and the descriptions thereof). The liquefied cooling medium (denoted by circles 413 as shown in FIG. 6) may be deposited on the surface of the second cold head 112, and flow along the surface of the fins 113 of the second cold head 112 (e.g., the recesses 409).

Figure 7:
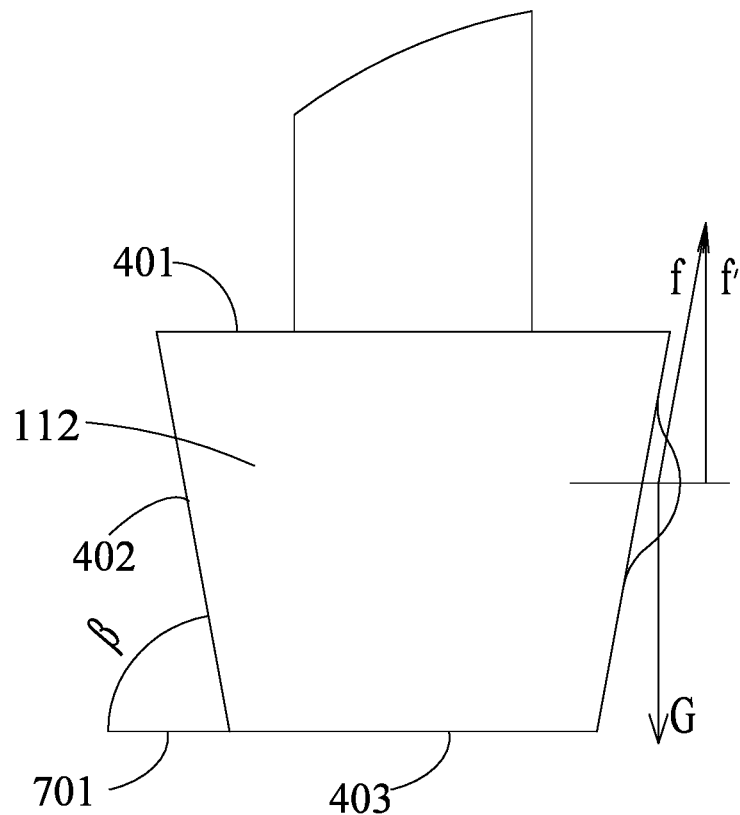
FIG. 7 is a schematic diagram illustrating an exemplary second cold head according to some embodiments of the present disclosure.

FIG. 7 is a schematic diagram illustrating an exemplary second cold head according to some embodiments of the present disclosure. As shown in FIG. 7, the second cold head 112 may be shaped as a truncated cone including a first circular end 401, a second circular end 403, and a side surface 402 as described in FIG. 3. The side surface 402 and the horizon surface 701 may form an angle denoted by β. In some embodiments, β may be greater than 0 degree and less than 90 degrees.

In some embodiments, the liquid helium (an exemplary cooling medium) may have properties including a viscosity of $3.244 \times 10^{-6}$ Pa·s and a surface tension coefficient of $8.954 \times 10^{-3}$ N/m, at 4.2 K, 0.1 MPa, and a thermal conductivity of 0.0186 W/(m.K). When the liquefied cooling medium flows along the plurality of protrusions 113 of the second cold head 112, the liquefied cooling medium may form a cooling medium film. The cooling film may increase the thermal resistance between the second cold head 112 and the surrounding vapor-state cooling medium under the affection of a resultant force consist of an external friction, a viscous force, and a surface tension of the cooling medium. The resultant force is denoted by f. The resultant force may include a vertical force denoted by f'. For example, f' may be equal to f multiplied by sin β, i.e., f'=f×sin β. The vertical force f' may prevent the liquid-state cooling medium from dropping to the bottom region of the tank 120.

The gravity of the liquid-state cooling medium denoted by G may be greater than vertical force denoted by f'. The tendency of the cooling medium film to flow downward may be strengthened and the thickness of the cooling medium film may be reduced. Therefore, the thermal resistance between the second cold head 112 and the surrounding vapor-state cooling medium may be reduced. The heat exchange efficiency between the second cold head 112 and the vapor-state cooling medium may be promoted.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A cryostat for a magnetic resonance imaging system, comprising:
    a tank containing a cavity to accommodate a cooling medium and a superconducting coil; and
    a cold head assembly configured to cool the cooling medium to maintain the superconducting coil in a superconducting state,
    the cold head assembly being mounted on the tank,
    a central axis of the cold head assembly and a vertical line forming an angle,
    the vertical line passing a reference point of the central axis of the cold head assembly,
    the vertical line being parallel to a vertical plane including an axis of the superconducting coil and a cross-section of the superconducting coil,
    the cold head assembly including a first cold head and a second cold head;
    the first cold head being maintained at a first temperature;
    the second cold head being maintained at a second temperature lower than the first temperature;
    the second cold head having a taper shape with a first end surface close to the first cold head and a second end surface away from the first cold head, wherein
    a surface of the second cold head includes a plurality of protrusions;
    one of the plurality of protrusions has a first end close to the first cold head and a second end away from the first cold head; and
    a thickness of the first end of the protrusion is greater than a thickness of the second end of the protrusion, the thickness of the first end referring to a width of a contact region between the first end of the protrusion and the second cold head, and the thickness of the second end referring to a width of a contact region between the second end of the protrusion and the second cold head.

2. The system of claim 1, wherein the cold head assembly is inclined away relative to the vertical plane.

3. The system of claim 1, wherein the cold head assembly is inclined along the axis of the superconducting coil.

4. The system of claim 1, wherein the angle is equal to or less than 45 degrees.

5. The system of claim 1, wherein a recess is formed between two adjacent protrusions of the plurality of protrusions.

6. The system of claim 5, wherein:
    the one of the plurality of protrusions has a fin-like shape.

7. The system of claim 5, wherein the surface of the second cold head or a surface of the plurality of protrusions is polished or has a plating layer.

8. The system of claim 7, further comprising:
    a radiation shield;
    a vacuum layer, the radiation shield and the vacuum layer enclosing the tank; and
    a heat conductive band located in the vacuum layer and configured to thermally connect the radiation shield and the cold head assembly.

9. The system of claim 1, wherein the taper shape includes a shape of triangular prism, polygonous prism or truncated cone.

10. The system of claim 1, wherein a diameter of the first end surface is greater than a diameter of the second end surface.

11. A system, comprising:
a cold head assembly including at least a first cold head and a second cold head, wherein:
the first cold head is maintained at a first temperature;
the second cold head is maintained at a second temperature lower than the first temperature;
the second cold head has a taper shape with a first end surface close to the first cold head and a second end surface away from the first cold head; and
a diameter of the first end surface is greater than a diameter of the second end surface, wherein
a surface of the second cold head includes a plurality of protrusions;
one of the plurality of protrusions has a first end close to the first cold head and a second end away from the first cold head; and
a thickness of the first end of the protrusion is greater than a thickness of the second end of the protrusion, the thickness of the first end referring to a width of a contact region between the first end of the protrusion and the second cold head, and the thickness of the second end referring to a width of a contact region between the second end of the protrusion and the second cold head.

12. The system of claim 11, wherein a recess is formed between two adjacent protrusions of the plurality of protrusions.

13. The system of claim 12, wherein
the one of the plurality of protrusions has a fin-like shape.

14. The system of claim 12, wherein the surface of the second cold head or a surface of the plurality of protrusions is polished or has a plating layer.

15. The system of claim 11, further comprising a tank, containing a cavity to accommodate a cooling medium and a superconducting coil,
wherein the cold head assembly is mounted on a side of the tank, and configured to cool the cooling medium to maintain the superconducting coil in a superconducting state, a central axis of the cold head assembly and a vertical line forming an angle, the vertical line passing a reference point of the central axis of the cold head assembly, the vertical line being parallel to a vertical plane including an axis of the superconducting coil and a cross-section of the superconducting coil.

16. The system of claim 15, wherein the cold head assembly is inclined away relative to the vertical plane.

17. The system of claim 15, wherein the cold head assembly is inclined along the axis of the superconducting coil.

18. The system of claim 15, wherein the angle is equal to or less than 45 degrees.

19. The system of claim 15, further comprising:
a radiation shield;
a vacuum layer, the radiation shield and the vacuum layer enclosing the tank; and
a heat conductive band located in the vacuum layer and configured to thermally connect the radiation shield and the cold head assembly.

20. The system of claim 11, wherein the taper shape includes a shape of triangular prism, polygonous prism or truncated cone.

* * * * *